(12) United States Patent
Danilov et al.

(10) Patent No.: US 11,023,331 B2
(45) Date of Patent: Jun. 1, 2021

(54) FAST RECOVERY OF DATA IN A GEOGRAPHICALLY DISTRIBUTED STORAGE ENVIRONMENT

(71) Applicant: EMC IP Holding Company LLC, Hopkinton, MA (US)

(72) Inventors: Mikhail Danilov, Saint Petersburg (RU); Yohannes Altaye, Dumfries, VA (US)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 92 days.

(21) Appl. No.: 16/240,272

(22) Filed: Jan. 4, 2019

(65) Prior Publication Data

US 2020/0218616 A1 Jul. 9, 2020

(51) Int. Cl.
| | |
|---|---|
| *G06F 11/14* | (2006.01) |
| *H04L 29/08* | (2006.01) |
| *G06F 16/27* | (2019.01) |
| *G06F 11/10* | (2006.01) |
| *H03M 13/15* | (2006.01) |

(52) U.S. Cl.
CPC ...... *G06F 11/1464* (2013.01); *G06F 11/1076* (2013.01); *G06F 11/1469* (2013.01); *G06F 16/27* (2019.01); *H03M 13/154* (2013.01); *H04L 67/1097* (2013.01)

(58) Field of Classification Search
CPC .. G06F 11/1464; G06F 11/1076; G06F 16/27; G06F 11/1469; H04L 67/1097; H03M 13/154

See application file for complete search history.

(56) References Cited

U.S. PATENT DOCUMENTS

| | | | |
|---|---|---|---|
| 5,675,802 A | 10/1997 | Allen et al. | |
| 5,805,788 A | 9/1998 | Johnson | |
| 5,950,225 A | 9/1999 | Kleiman | |
| 6,502,243 B1 | 12/2002 | Thomas | |

(Continued)

OTHER PUBLICATIONS

F4: Facebook's Warm Blob Storage System (Muralidhar et al.), 11th USENIX Symposium on Operating Systems Design and Implementation. (Year: 2014).*

(Continued)

*Primary Examiner* — Masud K Khan
(74) *Attorney, Agent, or Firm* — Amin, Turocy & Watson, LLP

(57) ABSTRACT

Described herein, system that facilitates recovery of an object segment in a geographically distributed storage environment. According to an embodiment, a system can comprise receiving a read request to read an object segment from a first data chunk stored in a geographically diverse data storage system, wherein the first data chunk is inaccessible, executing a GEO recovery process in response to determining that the first data chunk is inaccessible, wherein the GEO recovery process comprises accessing a first slice of data from a second data chunk stored in the geographically diverse data storage system, accessing a second slice of data from a third data chunk stored in the geographically diverse data storage system, and applying an XOR operation to the first slice of data and the second slice of data to determine a third slice of data, and extracting the object segment from the third slice of data.

20 Claims, 10 Drawing Sheets

(56) References Cited

U.S. PATENT DOCUMENTS

| | | |
|---|---|---|
| 7,389,393 B1 | 6/2008 | Karr et al. |
| 7,577,091 B2 | 8/2009 | Antal et al. |
| 7,631,051 B1 | 12/2009 | Fein et al. |
| 7,664,839 B1 | 2/2010 | Karr et al. |
| 7,680,875 B1 | 3/2010 | Shopiro et al. |
| 7,721,044 B1 | 5/2010 | Chatterjee et al. |
| 8,125,406 B1 | 2/2012 | Jensen et al. |
| 8,261,033 B1 | 9/2012 | Slik et al. |
| 8,370,542 B2 | 2/2013 | Lu et al. |
| 8,479,037 B1 | 7/2013 | Chatterjee et al. |
| 8,495,465 B1 | 7/2013 | Knholt et al. |
| 8,540,625 B2 | 9/2013 | Miyoshi |
| 8,751,599 B2 | 6/2014 | Tran et al. |
| 8,751,740 B1 | 6/2014 | De Forest et al. |
| 8,799,746 B2 | 8/2014 | Baker et al. |
| 8,832,234 B1 | 9/2014 | Brooker et al. |
| 8,856,619 B1 | 10/2014 | Cypher |
| 8,856,624 B1 | 10/2014 | Paniconi |
| 8,972,478 B1 | 3/2015 | Storer et al. |
| 9,003,086 B1 | 4/2015 | Schuller et al. |
| 9,021,296 B1 | 4/2015 | Kiselev et al. |
| 9,037,825 B1 | 5/2015 | Donlan et al. |
| 9,052,942 B1 | 6/2015 | Barber et al. |
| 9,063,838 B1 | 6/2015 | Boyle et al. |
| 9,098,447 B1 | 8/2015 | Donlan et al. |
| 9,208,009 B2 | 12/2015 | Resch et al. |
| 9,218,135 B2 | 12/2015 | Miller et al. |
| 9,244,761 B2 | 1/2016 | Yekhanin et al. |
| 9,268,783 B1 | 2/2016 | Shilane et al. |
| 9,274,903 B1 | 3/2016 | Garlapati et al. |
| 9,280,430 B2 | 3/2016 | Sarfare et al. |
| 9,405,483 B1 | 8/2016 | Wei et al. |
| 9,477,682 B1 | 10/2016 | Bent et al. |
| 9,495,241 B2 | 11/2016 | Flynn et al. |
| 9,619,256 B1 | 4/2017 | Natanzon et al. |
| 9,641,615 B1 | 5/2017 | Robins et al. |
| 9,665,428 B2 | 5/2017 | Vairavanathan et al. |
| 9,747,057 B1 | 8/2017 | Ramani et al. |
| 9,817,713 B2 | 11/2017 | Gupta et al. |
| 9,864,527 B1 | 1/2018 | Srivastav et al. |
| 9,942,084 B1 | 4/2018 | Sorenson, III |
| 10,001,947 B1 | 6/2018 | Chatterjee et al. |
| 10,007,561 B1 | 6/2018 | Pudipeddi et al. |
| 10,055,145 B1 | 8/2018 | Danilov et al. |
| 10,061,668 B1 | 8/2018 | Lazier et al. |
| 10,127,234 B1 | 11/2018 | Krishnan et al. |
| 10,216,770 B1 | 2/2019 | Kulesza et al. |
| 10,242,022 B1 | 3/2019 | Jain et al. |
| 10,282,262 B2 | 5/2019 | Panara et al. |
| 10,289,488 B1 | 5/2019 | Danilov et al. |
| 10,331,516 B2 | 6/2019 | Danilov et al. |
| 10,361,810 B2 | 7/2019 | Myung et al. |
| 10,496,330 B1 | 12/2019 | Bemat et al. |
| 10,503,611 B1 | 12/2019 | Srivastav et al. |
| 10,567,009 B2 | 2/2020 | Yang et al. |
| 10,579,490 B2 | 3/2020 | Danilov et al. |
| 10,613,780 B1 | 4/2020 | Naeni et al. |
| 10,733,053 B1 | 8/2020 | Miller et al. |
| 10,797,863 B2 | 10/2020 | Chen et al. |
| 2002/0166026 A1 | 11/2002 | Ulrich et al. |
| 2002/0191311 A1 | 12/2002 | Ulrich et al. |
| 2005/0080982 A1 | 4/2005 | Vasilevsky et al. |
| 2005/0088318 A1 | 4/2005 | Liu et al. |
| 2005/0108775 A1 | 5/2005 | Bachar et al. |
| 2005/0140529 A1 | 6/2005 | Choi et al. |
| 2005/0234941 A1 | 10/2005 | Watanabe |
| 2006/0047896 A1 | 3/2006 | Nguyen et al. |
| 2006/0075007 A1 | 4/2006 | Anderson et al. |
| 2006/0143508 A1 | 6/2006 | Mochizuki et al. |
| 2006/0265211 A1 | 11/2006 | Canniff et al. |
| 2007/0076321 A1 | 4/2007 | Takahashi et al. |
| 2007/0239759 A1 | 10/2007 | Shen et al. |
| 2007/0250674 A1 | 10/2007 | Findberg et al. |
| 2008/0222480 A1 | 9/2008 | Huang et al. |
| 2008/0222481 A1 | 9/2008 | Huang et al. |
| 2008/0244353 A1 | 10/2008 | Dholakia et al. |
| 2008/0320061 A1 | 12/2008 | Aszmann et al. |
| 2009/0070771 A1 | 3/2009 | Yuyitung et al. |
| 2009/0113034 A1 | 4/2009 | Krishnappa et al. |
| 2009/0172464 A1 | 7/2009 | Byrne et al. |
| 2009/0183056 A1 | 7/2009 | Aston |
| 2009/0204959 A1 | 8/2009 | Anand et al. |
| 2009/0240880 A1 | 9/2009 | Kawaguchi |
| 2009/0259882 A1 | 10/2009 | Shellhamer |
| 2010/0031060 A1 | 2/2010 | Chew et al. |
| 2010/0094963 A1 | 4/2010 | Zuckerman et al. |
| 2010/0218037 A1 | 8/2010 | Swartz et al. |
| 2010/0293348 A1 | 11/2010 | Ye et al. |
| 2010/0332748 A1 | 12/2010 | Van der Goot et al. |
| 2011/0029836 A1 | 2/2011 | Dhuse et al. |
| 2011/0106972 A1 | 5/2011 | Grube et al. |
| 2011/0107165 A1 | 5/2011 | Resch et al. |
| 2011/0138148 A1 | 6/2011 | Friedman et al. |
| 2011/0161712 A1 | 6/2011 | Athalye et al. |
| 2011/0196833 A1 | 8/2011 | Drobychev et al. |
| 2011/0246503 A1 | 10/2011 | Bender et al. |
| 2011/0292054 A1 | 12/2011 | Boker et al. |
| 2012/0023291 A1 | 1/2012 | Zeng et al. |
| 2012/0096214 A1 | 4/2012 | Lu et al. |
| 2012/0191675 A1 | 7/2012 | Kim et al. |
| 2012/0191901 A1 | 7/2012 | Norair |
| 2012/0204077 A1 | 8/2012 | D'Abreu et al. |
| 2012/0233117 A1 | 9/2012 | Holt et al. |
| 2012/0311395 A1 | 12/2012 | Leggette et al. |
| 2012/0317234 A1 | 12/2012 | Bohrer et al. |
| 2012/0321052 A1 | 12/2012 | Morrill et al. |
| 2013/0047187 A1 | 2/2013 | Frazier et al. |
| 2013/0054822 A1 | 2/2013 | Mordani et al. |
| 2013/0067159 A1 | 3/2013 | Mehra |
| 2013/0067187 A1 | 3/2013 | Moss et al. |
| 2013/0088501 A1 | 4/2013 | Fell |
| 2013/0097470 A1 | 4/2013 | Hwang et al. |
| 2013/0145208 A1 | 6/2013 | Yen et al. |
| 2013/0238932 A1 | 9/2013 | Resch |
| 2013/0246876 A1 | 9/2013 | Manssour et al. |
| 2013/0290482 A1 | 10/2013 | Leggette |
| 2013/0305365 A1 | 11/2013 | Rubin et al. |
| 2014/0040417 A1 | 2/2014 | Galdwin et al. |
| 2014/0064048 A1 | 3/2014 | Cohen et al. |
| 2014/0115182 A1 | 4/2014 | Sabaa et al. |
| 2014/0164430 A1 | 6/2014 | Hadjieleftheriou et al. |
| 2014/0164694 A1 | 6/2014 | Storer |
| 2014/0250450 A1 | 9/2014 | Yu et al. |
| 2014/0280375 A1 | 9/2014 | Rawson et al. |
| 2014/0281804 A1 | 9/2014 | Resch |
| 2014/0297955 A1 | 10/2014 | Yamazaki et al. |
| 2014/0331100 A1 | 11/2014 | Dhuse et al. |
| 2014/0358972 A1 | 12/2014 | Guarneri et al. |
| 2014/0359244 A1 | 12/2014 | Chambliss et al. |
| 2014/0380088 A1 | 12/2014 | Bennett et al. |
| 2014/0380125 A1 | 12/2014 | Calder et al. |
| 2015/0006846 A1 | 1/2015 | Youngworth |
| 2015/0074065 A1 | 3/2015 | Christ et al. |
| 2015/0112951 A1 | 4/2015 | Narayanamurthy et al. |
| 2015/0134626 A1 | 5/2015 | Theimer et al. |
| 2015/0142863 A1 | 5/2015 | Yuen et al. |
| 2015/0178007 A1 | 6/2015 | Moisa et al. |
| 2015/0186043 A1 | 7/2015 | Kesselman et al. |
| 2015/0269025 A1 | 9/2015 | Krishnamurthy et al. |
| 2015/0303949 A1 | 10/2015 | Jafarkhani et al. |
| 2015/0331766 A1 | 11/2015 | Sarfare et al. |
| 2015/0370656 A1 | 12/2015 | Tsafrir et al. |
| 2016/0011935 A1 | 1/2016 | Luby |
| 2016/0011936 A1 | 1/2016 | Luby |
| 2016/0055054 A1 | 2/2016 | Patterson, III et al. |
| 2016/0162378 A1 | 6/2016 | Garlapati et al. |
| 2016/0169692 A1 | 6/2016 | Gupta |
| 2016/0170668 A1 | 6/2016 | Mehra |
| 2016/0217104 A1 | 7/2016 | Kamble et al. |
| 2016/0232055 A1 | 8/2016 | Vairavanathan et al. |
| 2016/0253400 A1 | 9/2016 | McAlister et al. |
| 2016/0277497 A1 | 9/2016 | Bannister et al. |
| 2016/0292429 A1 | 9/2016 | Bannister et al. |
| 2016/0294419 A1 | 10/2016 | Sandell et al. |

(56) References Cited

U.S. PATENT DOCUMENTS

| | | | |
|---|---|---|---|
| 2016/0328295 A1 | 11/2016 | Baptist et al. | |
| 2016/0357649 A1 | 12/2016 | Karrotu et al. | |
| 2016/0371145 A1 | 12/2016 | Akutsu et al. | |
| 2016/0378624 A1 | 12/2016 | Jenkins, Jr. et al. | |
| 2016/0380650 A1 | 12/2016 | Calder et al. | |
| 2017/0003880 A1 | 1/2017 | Fisher et al. | |
| 2017/0004044 A1 | 1/2017 | Tormasov et al. | |
| 2017/0017671 A1 | 1/2017 | Baptist et al. | |
| 2017/0031945 A1 | 2/2017 | Sarab et al. | |
| 2017/0097875 A1* | 4/2017 | Jess | G06F 11/1092 |
| 2017/0102993 A1 | 4/2017 | Hu et al. | |
| 2017/0116088 A1* | 4/2017 | Anami | G06F 3/0643 |
| 2017/0187398 A1 | 6/2017 | Trusov | |
| 2017/0187766 A1 | 6/2017 | Zheng et al. | |
| 2017/0206025 A1 | 7/2017 | Viswanathan | |
| 2017/0206135 A1 | 7/2017 | Zeng | |
| 2017/0212680 A1 | 7/2017 | Waghulde | |
| 2017/0212845 A1 | 7/2017 | Conway | |
| 2017/0235507 A1 | 8/2017 | Sinha et al. | |
| 2017/0262187 A1 | 9/2017 | Manzanares et al. | |
| 2017/0268900 A1 | 9/2017 | Nicolaas et al. | |
| 2017/0285952 A1 | 10/2017 | Danilov et al. | |
| 2017/0286009 A1 | 10/2017 | Danilov et al. | |
| 2017/0286436 A1 | 10/2017 | Neporada et al. | |
| 2017/0286516 A1 | 10/2017 | Horowitz et al. | |
| 2017/0288701 A1 | 10/2017 | Slik et al. | |
| 2017/0344285 A1 | 11/2017 | Choi et al. | |
| 2018/0052744 A1 | 2/2018 | Chen et al. | |
| 2018/0063213 A1 | 3/2018 | Bevilacqua-Linn et al. | |
| 2018/0074881 A1 | 3/2018 | Burden | |
| 2018/0121286 A1 | 5/2018 | Sipos | |
| 2018/0129417 A1 | 5/2018 | Sivasubramanian et al. | |
| 2018/0181324 A1 | 6/2018 | Daniliv et al. | |
| 2018/0181475 A1 | 6/2018 | Danilov et al. | |
| 2018/0181612 A1 | 6/2018 | Daniliv et al. | |
| 2018/0246668 A1 | 8/2018 | Sakashita et al. | |
| 2018/0267856 A1 | 9/2018 | Hayasaka et al. | |
| 2018/0267985 A1 | 9/2018 | Badey et al. | |
| 2018/0306600 A1 | 10/2018 | Nicolaas et al. | |
| 2018/0307560 A1 | 10/2018 | Vishnumolakala et al. | |
| 2018/0341662 A1 | 11/2018 | He | |
| 2018/0375936 A1 | 12/2018 | Chirammal et al. | |
| 2019/0028179 A1 | 1/2019 | Kalhan | |
| 2019/0034084 A1 | 1/2019 | Nagarajan et al. | |
| 2019/0043201 A1 | 2/2019 | Strong et al. | |
| 2019/0043351 A1 | 2/2019 | Yang et al. | |
| 2019/0050301 A1 | 2/2019 | Juniwal et al. | |
| 2019/0065092 A1 | 2/2019 | Shah et al. | |
| 2019/0065310 A1 | 2/2019 | Rozas | |
| 2019/0114223 A1 | 4/2019 | Pydipaty et al. | |
| 2019/0205437 A1 | 7/2019 | Larson et al. | |
| 2019/0215017 A1 | 7/2019 | Danilov et al. | |
| 2019/0220207 A1 | 7/2019 | Lingarajappa | |
| 2019/0356416 A1 | 11/2019 | Yanovsky et al. | |
| 2019/0384500 A1 | 12/2019 | Danilov et al. | |
| 2019/0386683 A1 | 12/2019 | Danilov et al. | |
| 2020/0026810 A1 | 1/2020 | Subramaniam et al. | |
| 2020/0042178 A1 | 2/2020 | Danilov et al. | |
| 2020/0050510 A1 | 2/2020 | Chien et al. | |
| 2020/0104377 A1 | 4/2020 | Eamesty, Jr. et al. | |
| 2020/0117556 A1 | 4/2020 | Zou et al. | |

OTHER PUBLICATIONS

Final Office Action dated Feb. 12, 2020 for U.S. Appl. No. 16/024,314, 29 pages.
Non-Final Office Action received for U.S. Appl. No. 16/010,255 dated Jan. 9, 2020, 31 pages.
Office Action dated Feb. 5, 2020 for U.S. Appl. No. 16/261,551, 30 pages.
Non-Final Office Action received for U.S. Appl. No. 16/228,612 dated Feb. 27, 2020, 49 pages.
Final Office Action received for U.S. Appl. No. 16/010,246 dated Mar. 16, 2020, 33 pages.
Final Office Action received for U.S. Appl. No. 15/656,382 dated Apr. 6, 2020, 31 pages.
Non-Final Office Action received for U.S. Appl. No. 15/582,167 dated Sep. 7, 2018, 19 pages.
Non-Final Office Action received for U.S. Appl. No. 15/952,179 dated Apr. 20, 2020, 68 pages.
Notice of Allowance dated May 4, 2020 for U.S. Appl. No. 16/240,193, 46 pages.
Office Action dated May 11, 2020 for U.S. Appl. No. 16/177,278, 53 pages.
Office Action dated May 8, 2020 for U.S. Appl. No. 16/231,018, 78 pages.
Notice of Allowance dated May 11, 2020 for U.S. Appl. No. 16/240,193, 24 pages.
Wikipedia, Standard Raid Levels—RAID 6", URL: https://en.wikipedia.org/wiki/Standard_RAID_levels#RAID_6", Oct. 18, 2019, 11 pages.
Non-Final Office Action received for U.S. Appl. No. 15/656,382 dated Nov. 1, 2019, 47 pages.
Final Office Action received for U.S. Appl. No. 15/952,179 dated Nov. 26, 2019, 53 pages.
Non Final Office Action received for U.S. Appl. No. 16/024,314 dated Nov. 25, 2019, 42 pages.
Non-Final Office Action received for U.S. Appl. No. 16/177, 278 dated Dec. 2, 2019, 55 pages.
Non-Final Office Action received for U.S. Appl. No. 15/651,504 dated Dec. 31, 2019, 18 pages.
Non-Final Office Action received for U.S. Appl. No. 16/010,246 dated Dec. 5, 2019, 67 pages.
Stonebreaker et al. "Distributed RAID—A New Multiple Copy Algorithm.", IEEE ICDE, 1990, pp. 430-437.
Muralidhar et al. "f4: Facebook's Warm Blob Storage System", USENIX. OSDI, Oct. 2014, pp. 383-398.
Non-Final Office Action received for U.S. Appl. No. 15/794,950 dated Jul. 9, 2019, 29 pages.
Final Office Action received for U.S. Appl. No. 15/651,504 dated Sep. 18, 2019, 15 pages.
Non-Final Office Action received for U.S. Appl. No. 15/952,179 dated Sep. 10, 2019, 42 pages.
Non-Final Office Action received for U.S. Appl. No. 15/651,504 dated Mar. 21, 2019, 10 pages.
Non-Final Office Action received for U.S. Appl. No. 15/662,273 dated Nov. 16, 2018, 19 pages.
Final Office Action received for U.S. Appl. No. 15/662,273 dated May 15, 2019, 33 pages.
Non-Final Office Action received for U.S. Appl. No. 15/965,479 dated Apr. 15, 2019, 21 pages.
Non-Final Office Action received for U.S. Appl. No. 16/228,624 dated Jun. 24, 2020, 65 pages.
Office Action received for U.S. Appl. No. 16/254,073, dated Aug. 18, 2020, 62 pages.
Non-Final Office Action received for U.S. Appl. No. 16/228,612 dated Jun. 29, 2020, 62 pages.
Final Office Action received for U.S. Appl. No. 16/010,255 dated Jul. 23, 2020, 36 pages.
Office Action received for U.S. Appl. No. 16/010,246 dated Jul. 27, 2020 36 pages.
Office Action received for U.S. Appl. No. 16/177,278, dated Aug. 21, 2020, 53 pages.
Office Action received for U.S. Appl. No. 16/179,486, dated Aug. 13, 2020, 64 pages.
Guo et al., "GeoScale: Providing Geo-Elasticity in Distributed Clouds" 2016 IEEE International Conference on Cloud Engineering, 4 pages.
Guo et al., "Providing Geo-Elasticity in Geographically Distributed Clouds", ACM Transactions on Internet Technology, vol. 18, No. 3, Article 38. Apr. 2018. 27 pages.
Non-Final Office Action received for U.S. Appl. No. 16/209,185 dated Jun. 18, 2020, 22 pages.
Martin Hosken, Developing a Hyper-Converged Storage Strategy for VMware vCloud Director with VMware vSAN, Jan. 2018 (Year: 2018).

(56) References Cited

OTHER PUBLICATIONS

Non-Final Office Action received for U.S. Appl. No. 16/261,549 dated Apr. 15, 2020, 22 pages.
Non-Final Office Action received for U.S. Appl. No. 16/374,726 dated Jun. 2, 2020, 47 pages.
Natarajan, RAID 0, RAID 1, RAID 5, RAID 10 Explained with Diagrams, Aug. 10, 2010, thegeekstuff.com (18 pages).
Non-Final Office Action received for U.S. Appl. No. 16/177,285 dated Jul. 22, 2020, 31 pags.
Non-Final Office Action received for U.S. Appl. No. 16/261,547 dated Sep. 3, 2020, 26 pages.
Non-Final Office Action received for U.S. Appl. No. 16/261,548 dated Aug. 21, 2020, 42 pages.
Notice of Allowance received for U.S. Appl. No. 16/261,549 dated Jul. 17, 2020, 40 pages.
Qiang et al., "Dynamics Process of Long-running Allocation/ Collection in Linear Storage Space", International Conference on Networking, Architecture, and Storage (NAS 2007), Guilin, 2007, pp. 209-216.
Non-Final Office Action received for U.S. Appl. No. 16/374,725 dated Aug. 19, 2020, 50 pages.
Non-Final Office Action received for U.S. Appl. No. 16/511,161 dated Jul. 10, 2020, 24 pages.
Notice of Allowance received for U.S. Appl. No. 15/862,547 dated Mar. 29, 2019 27 pages.
Non-Final Office Action received for U.S. Appl. No. 15/792,714 dated Apr. 4, 2019, 20 pages.
Final Office Action received for U.S. Appl. No. 15/792,714 dated Sep. 12, 2019, 43 pages.
Wikipedia "Garbage Collection", URL: https://en.wikipedia.org/wiki/Garbage_collection_(computer science)#Availability (Year: 2017) retrieved using the WayBackMachine, Sep. 8, 2017, 8 pages.
Wikipedia "Erasure code", URL: https://web.archive.org/web/20170908171158/https://en.wikipedia.org/wiki/Erasure_code (Year: 2017), retrieved using the WayBackMachine, Sep. 8, 2017, 5 pages.
Wikipedia "Front and back ends" URL: https://en.wikipedia.org/wiki/Front_and_back_ends (Year:2019), Sep. 6, 2019, 4 pages.
Notice of Allowance received for U.S. Appl. No. 15/792,714 dated Nov. 8, 2019, 31 pages.
Non-Final Office Action received for U.S. Appl. No. 15/791,390 dated Sep. 20, 2019, 27 pages.
Final Office Action received for U.S. Appl. No. 15/791,390 dated Feb. 6, 2020, 29 pages.
Non-Final Office Action received for U.S. Appl. No. 15/791,390 dated Apr. 30, 2020, 48 pages.
Huang et al., "Scale-RS: An Efficient Scaling Scheme for RS-Coded Storage Clusters," in IEEE Transactions on Parallel and Distributed Systems, vol. 26, No. 6, pp. 1704-1717, Jun. 1, 2015.
Non-Final Office Action received for U.S. Appl. No. 16/457,615 dated Jul. 20, 2020, 34 pages.
Non-Final Office Action received for U.S. Appl. No. 16/526,142 dated Oct. 15, 2020, 21 pages.
Notice of Allowance received U.S. Appl. No. 16/228,612 date Oct. 20, 2020, 84 pages.
Zhou, et al. "Fast Erasure Coding for Data Storage: A Comprehensive Study of the Acceleration Techniques" Proceedings of the 17th Usenix Conference on File and Storage Technologies (FAST '19), [https://www.usenix.org/conference/fast19/presentation/zhou], Feb. 2019, Boston, MA, USA. 14 pages.
Non-Final Office Action received for U.S. Appl. No. 16/010,255 dated Oct. 29, 2020, 65 pages.
Non-Final Office Action received for U.S. Appl. No. 16/399,902 dated Oct. 28, 2020, 83 pages.
Notice of Allowance received for U.S. Appl. No. 16/374,726 dated Nov. 20, 2020, 78 pages.
Final Office Action received for U.S. Appl. No. 16/228,624 dated Dec. 1, 2020, 63 pages.
Non-Final Office Action received for U.S. Appl. No. 16/570,657 dated Nov. 27, 2020, 75 pages.
Final Office Action received for U.S. Appl. No. 16/177,285 dated Dec. 30, 2020, 61 pages.
Final Office Action received for U.S. Appl. No. 16/511,161 dated Dec. 30, 2020, 61 pages.
Non-Final Office Action received for U.S. Appl. No. 16/399,895 dated Jan. 4, 2021, 64 pages.
Notice of Allowance received for U.S. Appl. No. 16/374,726 dated Jan. 6, 2021, 56 pages.
Non-Final Office Action received for U.S. Appl. No. 16/399,897 dated Feb. 19, 2021, 56 pages.
Non-Final Office Action received for U.S. Appl. No. 16/670,715 dated Mar. 31, 2021, 60 pages.
Final Office Action received for U.S. Appl. No. 16/177,278 dated Feb. 24, 2021, 109 pages.
EMC; "EMC ECS (Elastic Cloud Storage) Architectural Guide v2.x;" EMC; Jun., 2015; available at: https://www.dell.com/community/s/vjauj58549/attachments/vjauj58549/solutions-ch/477 /1/h14071-ecs-architectural-guide-wp.pdf, Jun. 2015, 21 pages.
Mohan et al., "Geo-aware erasure coding for high-performance erasure-coded storage clusters", Springer Link, Url: ittps://link.springer.com/article/10.1007/s 12243-017-0623-2, Jan. 18, 2018.
Final Office Action received for U.S. Appl. No. 16/179,486 dated Jan. 28, 2021, 55 pages.
Non-Final Office Action received for U.S. Appl. No. 16/670,746 dated Feb. 16, 2021, 55 pages.
Jell Technologies, "ECS Overview and Architecture", h14071.18, Feb. 2021, 55 pages.
Non-Final Office Action received for U.S. Appl. No. 16/177,285 dated Apr. 9, 2021, 41 pages.
Non-Final Office Action received for U.S. Appl. No. 16/779,208 dated Apr. 20, 2021, 71 pages.

\* cited by examiner

- OBJECT 1 SEGMENTS

- OBJECT 2 SEGMENTS

- OBJECT 3 SEGMENTS

FAST RECOVERY OF DATA IN A GEOGRAPHICALLY DISTRIBUTED STORAGE ENVIRONMENT

TECHNICAL FIELD

The subject disclosure relates generally to storage systems. More specifically, this disclosure relates to various embodiments for fast recovery of data in a geographically distributed storage environment.

BACKGROUND

The large increase in amount of data generated by digital systems has created a new set of challenges for data storage environments. Traditional storage area network (SAN) and/or network-attached storage (NAS) architectures have not been designed to support data storage and/or protection at large multi-petabyte capacity levels. Object storage technology can be utilized to meet these requirements. By utilizing object storage technology, organizations can not only keep up with rising capacity levels, but can also store these new capacity levels at a manageable cost point.

Typically, a scale-out, cluster-based, shared-nothing object storage that employs a microservices architecture pattern, for example, an ECS™ (formerly known as Elastic Cloud Storage) can be utilized as a storage environment for a new generation of workloads. ECS™ utilizes the latest trends in software architecture and development to achieve increased availability, capacity use efficiency, and performance. ECS™ uses a specific method for disk capacity management, wherein disk space is partitioned into a set of blocks of fixed size called chunks. User data is stored in these chunks and the chunks are shared. One chunk can comprise fragments of several user objects (e.g., object segments). Chunk content is modified in an append mode. When chunks become full, they are sealed, and the content of sealed chunks is immutable.

The above-described background relating to ECS™ is merely intended to provide a contextual overview of some current issues, and is not intended to be exhaustive. Other contextual information may become further apparent upon review of the following detailed description.

DETAILED DESCRIPTION

Figure 1:
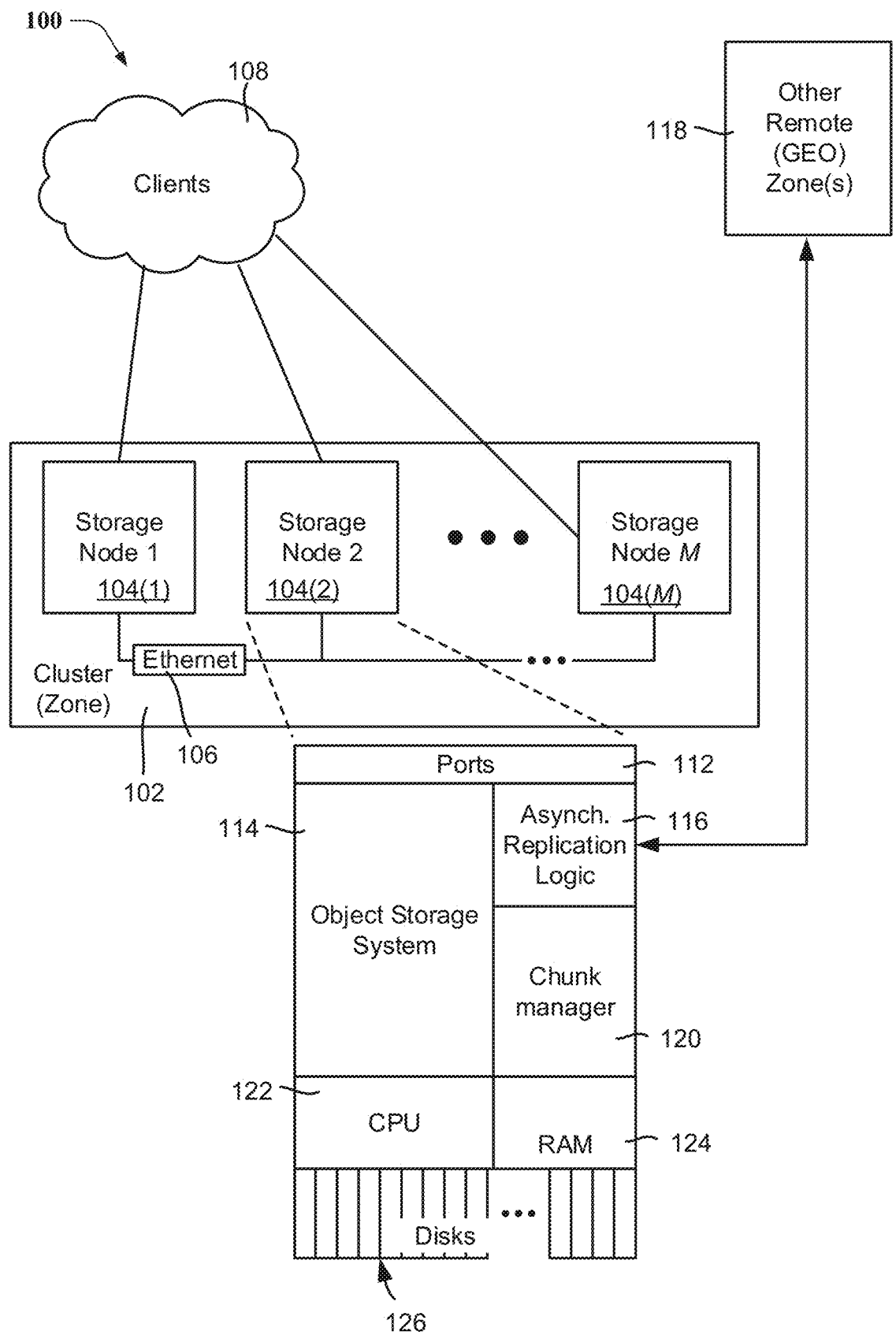
FIG. 1 illustrates an example cloud data storage system comprising that facilitates combining erasure-coded protection sets during meta chunk generation, according to one or more example implementations.

One or more embodiments are now described with reference to the drawings, wherein like reference numerals are used to refer to like elements throughout. In the following description, for purposes of explanation, numerous specific details are set forth in order to provide a thorough understanding of the various embodiments. It may be evident, however, that the various embodiments can be practiced without these specific details, e.g., without applying to any particular networked environment or standard. In other instances, well-known structures and devices are shown in block diagram form in order to facilitate describing the embodiments in additional detail.

The term "cloud" as used herein can refer to a cluster of nodes (e.g., set of network servers), for example, within a distributed object storage system, that are communicatively and/or operatively coupled to each other, and that host a set of applications utilized for servicing user requests. In general, the cloud computing resources can communicate with user devices via most any wired and/or wireless communication network to provide access to services that are based in the cloud and not stored locally (e.g., on the user device). A typical cloud-computing environment can include multiple layers, aggregated together, that interact with each other to provide resources for end-users.

Example systems and methods disclosed herein, in one or more embodiments, relate to cloud storage systems that utilize erasure coding for data protection, such as, but not limited to an ECS™ platform. The ECS™ platform combines the cost advantages of commodity infrastructure with the reliability, availability and serviceability of traditional arrays. ECS™ uses erasure coding approach to protect user data. With erasure coding, a data portion (D) is divided into k fragments. During encoding operation redundant m coding fragments are created. In an aspect, encoding assures that the system can tolerate the loss of any m fragments. In an embodiment, k data fragments and m coding fragments created for a single data portion form a protection set. In one aspect, the ECS™ platform can comprise a cluster of nodes (also referred to as "cluster" herein) that delivers scalable and simple public cloud services with the reliability and/or control of a private-cloud infrastructure. Moreover, the ECS™ platform comprises a scale-out, cluster-based, shared-nothing object storage, which employs a microservices architecture pattern. The ECS™ platform can support storage, manipulation, and/or analysis of unstructured data on a massive scale on commodity hardware. As an example, ECS™ can support mobile, cloud, big data, content-sharing, and/or social networking applications. ECS™ can be deployed as a turnkey storage appliance or as a software product that can be installed on a set of qualified commodity servers and/or disks. The ECS™ scale-out and geo-distributed architecture is a cloud platform that can provide at least the following features: (i) lower cost than public clouds; (ii) unmatched combination of storage efficiency and data access; (iii) anywhere read/write access with strong consistency that simplifies application development; (iv) no single point of failure to increase availability and performance; (v) universal accessibility that eliminates storage silos and inefficient extract, transform, load (ETL)/data movement processes; etc.

In an aspect, ECS™ does not rely on a file system for disk capacity management. Instead, ECS™ partitions disk space into a set of blocks of fixed size called chunks (e.g., having a chunk size of 128 MB). All user data is stored in these chunks and the chunks are shared. Typically, a chunk can comprise fragments of several different user objects. The chunk content can be modified in an append-only mode. When a chunk becomes full, it can be sealed and the content of a sealed chunk is immutable. Further, ECS™ does not employ traditional data protection instructions like mirroring or parity protection. Instead, ECS™ utilizes erasure coding for data protection. A chunk can be divided into indexed portions (e.g., data fragments or object segments), for example, by a chunk manager. An index of an object segment can be a numerical value assigned by the chunk manager and utilized for erasure coding. Moreover, the index of the object segment can be utilized to determine a coefficient, within an erasure coding matrix (e.g., the index can be utilized to determine a row and/or column of the matrix), which is to be combined (e.g., multiplied) with the object segment to generate a corresponding coding fragment for the chunk. In an aspect, a data chunk may comprise a plurality of object segments having a size of 2 MB that are appended in the data chunk. Thus, a data chunk of size 128 MB can have 64 object segments appended together. In general operation, a read request comprises a request to read (e.g., extract) single object segment. In an aspect, ECS™ is a cloud storage that supports geographically distributed setups consisting of two or more zones. The corresponding feature is called GEO. GEO can be used to provide an additional protection of user data by means of replication. The replication mechanism works at the chunks level. ECS may use GEO erasure coding technique to minimize capacity overhead associated with GEO data protection. Although the systems and methods disclosed herein have been described with respect to object storage systems (e.g., ECS™), it is noted that the subject specification is not limited to object storage systems and can be utilized for most any storage systems that utilize erasure coding for data protection and chunks for disk capacity management. Thus, any of the embodiments, aspects, concepts, structures, functionalities or examples described herein are non-limiting, and the technology may be used in various ways that provide benefits and advantages in computing and data storage in general.

Sometimes a GEO recovery is triggered for one or more chunks when a zone failure occurs. For example, when a storm knocks out power of a zone, all data chunks stored in that zone become inaccessible (e.g., inaccessible but not deleted). In general, the system does not try to recover all the data chunks at once. Instead, the system composes a list of chunks that require recovery and, at any moment, processes the limited number of them in parallel. A complete GEO recovery may take weeks/months. However, during this period of time the system attempts to serve all the read requests for objects that have their segments in chunks to recover. Without an efficient recovery technique, failure rate for such read request can be very high when zone with large number of chunks become inaccessible due to zone failure.

This would cause a negative user experience. On the fly GEO recovery is not feasible because that can overwhelm the system even for low read rate.

In some embodiments, when read request is received after a zone failure in a geographically distributed storage environment, the system executes a GEO recovery process. In some embodiments, the GEO recovery process comprises accessing a first slice of data (e.g., 2 MB) from a chunk stored in zone of the geographically diverse data storage system that is designated to serve the read request during failures (e.g., chunk X), accessing a second slice of data from a remote chunk (e.g., chunk B) that was used to create chunk X, and applying an exclusive-or operation, hereinafter 'XOR' operation (discussed below) to the first slice of data and the second slice of data to determine a third slice of data (e.g., slice from chunk that became inaccessible). Thereafter, the read request can be served using the third slice of data (e.g., object segment is extracted from the third slice). The advantage of recovering slice of data verses recovering the entire data chunk is that there is a faster recovery of data (e.g., recovering 2 MB versus recovering 128 MB and thereafter recovering the 2 MB). Recovery of a smaller portion of data means shorter recovery duration and, as a result, faster servicing of read requests and lesser probability of failed read requests. In an aspect, there is no immediate need to recover the data chunks. All the chunks can be recovered in parallel to serving the read requests. This will reduce or eliminate negative user experience while the system is recovering all the chunks that became inaccessible during a zone failure To the accomplishment of the foregoing and related ends, the disclosed subject matter, then, comprises one or more of the features hereinafter more fully described. The following description and the annexed drawings set forth in detail certain illustrative aspects of the subject matter. However, these aspects are indicative of but a few of the various ways in which the principles of the subject matter can be employed. Other aspects, advantages, and novel features of the disclosed subject matter will become apparent from the following detailed description when considered in conjunction with the provided drawings.

FIG. 1 shows part of a cloud data storage system such as ECS™ comprising a zone (e.g., cluster) 102 of storage nodes 104(1)-104(M), in which each node is typically a server configured primarily to serve objects in response to client requests (e.g., received from clients 108). The nodes 104(1)-104(M) can be coupled to each other via a suitable data communications link comprising interfaces and protocols such as, but not limited to, Ethernet block 106.

Clients 108 can send data system-related requests to the cluster 102, which in general is configured as one large object namespace; there may be on the order of billions of objects maintained in a cluster, for example. To this end, a node such as the node 104(2) generally comprises ports 112 by which clients connect to the cloud storage system. Example ports are provided for requests via various protocols, including but not limited to SMB (server message block), FTP (file transfer protocol), HTTP/HTTPS (hypertext transfer protocol), and NFS (Network File System); further, SSH (secure shell) allows administration-related requests, for example.

Each node, such as the node 104(2), includes an instance of an object storage system 114 and data services. For a cluster that comprises a "GEO" zone of a geographically distributed storage system, at least one node, such as the node 104(2), includes or coupled to reference tracking asynchronous replication logic 116 that synchronizes the cluster/zone 102 with each other remote GEO zone 118. Note that ECS™ implements asynchronous low-level replication, that is, not object level replication. Typically, organizations protect against outages or information loss by backing-up (e.g., replicating) their data periodically. During backup, one or more duplicate or deduplicated copies of the primary data are created and written to a new disk or to a tape, for example within a different zone. The term "zone" as used herein can refer to one or more clusters that is/are independently operated and/or managed. Different zones can be deployed within the same location (e.g., within the same data center) and/or at different geographical locations (e.g., within different data centers).

In general, and in one or more implementations, e.g., ECS™, disk space is partitioned into a set of large blocks of fixed size called chunks; user data is stored in chunks. Chunks are shared, that is, one chunk may contain segments of multiple user objects; e.g., one chunk may contain mixed segments of some number of (e.g., three) user objects.

A chunk manager 120 can be utilized to manage the chunks and their protection (e.g., via erasure coding (EC)). Erasure coding was created as a forward error correction method for binary erasure channel. However, erasure coding can be used for data protection on data storages. During erasure coding (e.g., utilizing a k+m configuration), the chunk manager 120 can partition a piece of data (e.g., chunk) into k data fragments of equal size. During encoding, redundant m coding fragments are created so that the system can tolerate the loss of any m fragments. Typically, the chunk manager 120 can assign indices to the data fragments (and corresponding coding fragments). In an example, an index can be a numerical value (e.g., 1 to k) that is utilized for erasure coding. Moreover, the index of a data fragment can be utilized to determine a coefficient, within an erasure coding matrix, which is to be combined (e.g., multiplied) with the data fragment to generate a corresponding coding fragment for the chunk. For example, an index value can specify a row and/or column of the coefficient within the erasure coding matrix. As an example, the indices can be assigned based on a defined sequence, in a random order, based on a defined criterion (e.g., to increase probability of complementary data fragments), based on operator preferences, etc. The process of coding fragments creation is called encoding. The process of data fragments recovery using available data and coding fragments is called decoding.

In one example embodiment, GEO erasure coding can also be utilized, wherein if a distributed storage 100 is to tolerate the loss of any m zones/clusters/chunks, then GEO erasure coding can begin at each zone by replicating each new chunk to at least m remote zones. As a result, there are m backup copies of each chunk. Typically, there is one primary backup copy, which can be utilized for encoding. Encoding is performed by one zone for primary backup chunks and other zones replicate to it. Once a zone has k primary chunks replicated from different remote zones, the zone can perform encoding using the chunks replicated to it as data fragments. The chunk size is fixed, in ECS™, with padding or other data to complement, wherein the other data is added as needed. The result of encoding is m data portions of a chunk size. They are stored as chunks of a specific type called coding chunks. After encoding is complete, the zone can store one coding chunk locally and move other m−1 coding chunks to remote zones making sure all the k+m data and coding chunks are stored at different zones whenever possible. Afterwards, the primary backup chunks used for encoding and their peer backup chunks at other zones can be deleted.

In some embodiments, the chunk manager 120 can efficiently generate combined data protection sets during consolidating two or more erasure-coded data portions (e.g., normal/source chunks) that have a reduced sets of data fragments. As an example, chunk manager 120 can verify that the two or more erasure-coded data portions are complementary (e.g., do not have data fragments with the same index) and perform a summing operation to combine their corresponding coding fragments to generate a combined protection set. A CPU 122 and RAM 124 are shown for completeness; note that the RAM 124 can comprise at least some non-volatile RAM. The node includes storage devices such as disks 126, comprising hard disk drives and/or solid-state drives. It is noted that the storage devices can comprise volatile memory(s) or nonvolatile memory(s), or both volatile and nonvolatile memory(s). Examples of suitable types of volatile and non-volatile memory are described below with reference to FIG. 10. The memory (e.g., data stores, databases, tables, etc.) of the subject systems and methods is intended to comprise, without being limited to, these and any other suitable types of memory.

Figure 2:
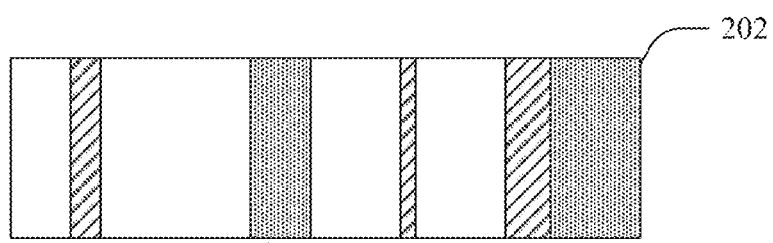
FIG. 2 illustrates an example layout of a chunk within an object storage system in accordance with an aspect of the specification.
Figure 2:
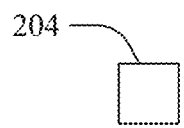
Figure 2:
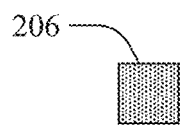
Figure 2:
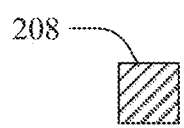

FIG. 2 illustrates an example layout 200 of a chunk within an object storage system in accordance with an aspect of the specification. In an aspect, disk space of the object storage system can be partitioned into a set of blocks of fixed size called chunks. As an example, the chunk size can be 128 MB. Typically, user data is stored in these chunks and the chunks are shared. As shown in FIG. 2, a chunk 202 can comprise segments of several user objects (e.g., object 1 segments 204, object 2 segments 206, and object 3 segments 208). It is noted that the chunk layout depicted in FIG. 2. is one example and the chunks can have most any other layout with segments from one or more user objects. Chunk content is modified in an append-only mode. When the chunk becomes full enough, it is sealed. After the chunk is sealed, its content is immutable.

In an aspect, the chunk can be protected by employing erasure coding. During erasure coding, a chunk can be divided into k data fragments of equal size. To encode the chunk, redundant m coding fragments are created so that the system can tolerate the loss of any m fragments. The process of generating the coding fragments is called encoding. The process of data fragments recovery using available data and coding fragments is called decoding. As an example, the encoding operation can be represented with the equation below:

$$C_i = \sum_{j=1}^{k} C_{i,j} \quad (1)$$

wherein, $$C_{i,j} = X_{i,j} * D_j \quad (2)$$

and wherein, $X_{i,j}$ is a defined coefficient from a coding matrix (e.g., wherein i, j, and/or k can be most any integer). Further, j is an index assigned to the data fragment. It is noted that $D_j$ are independent data fragments and $C_i$ are coding fragments.

Additionally, or optionally, the systems and methods disclosed herein can support geographically distributed set-ups (GEO) comprising two or more zones. GEO can be used to provide an additional protection of user data by means of replication. Replication works at the chunk level, wherein a backup copy of a chunk stored in a primary zone can be replicated to one or more secondary zones. Each zone protects the chunks it stores. If a copy of a chunk becomes inaccessible, it can be recovered using its other copy. This process is called GEO recovery. In case of GEO erasure coding, remote backup copies of data chunks are used as data fragments and coding fragments created for such data fragments are stored as coding chunks.

Figure 3:
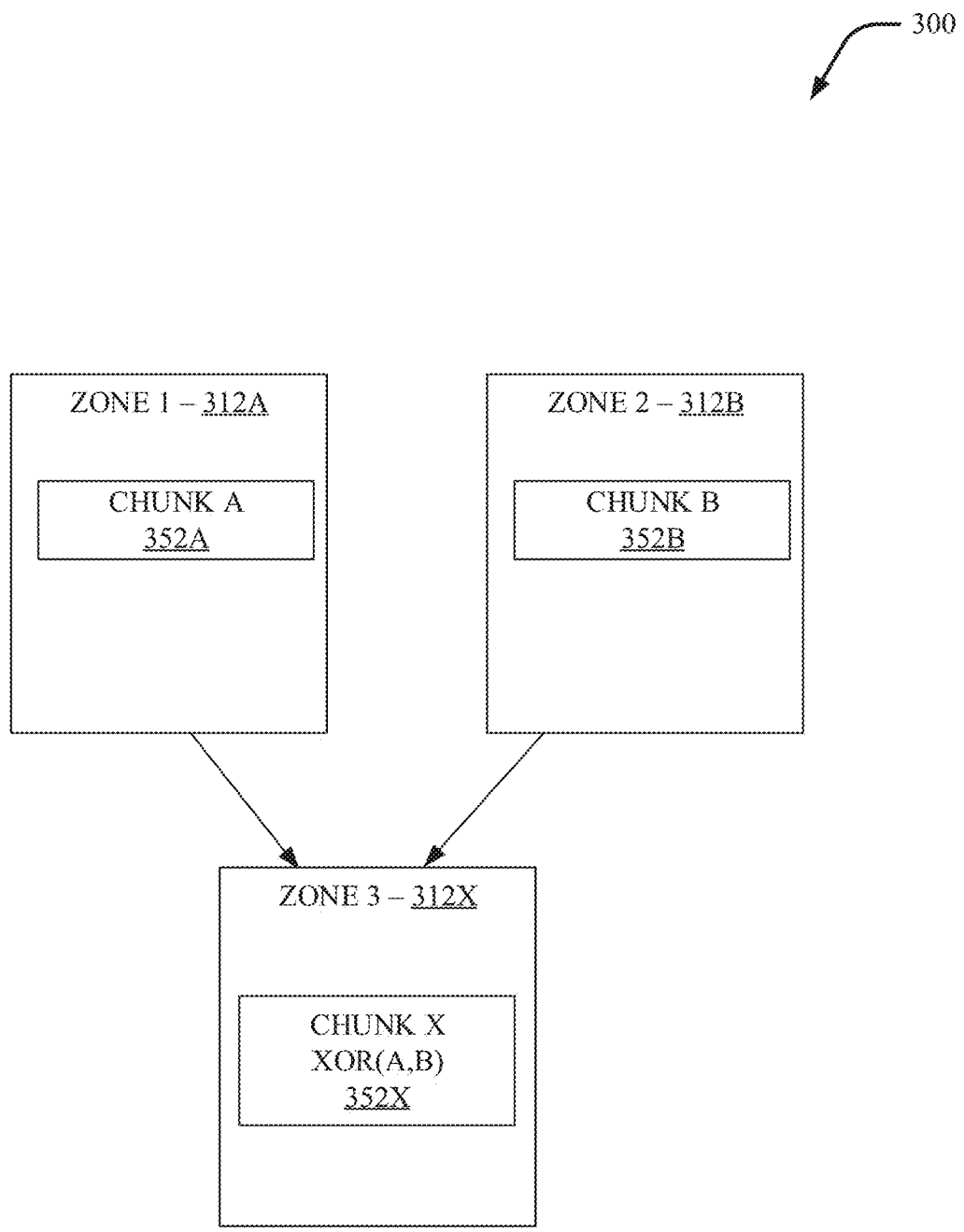
FIG. 3 illustrates an example of a geographically distributed storage system accordance with one or more embodiments described herein.

FIG. 3 illustrates an example of a geographically distributed storage system 300 accordance with one or more embodiments described herein. Repetitive description of like elements employed in respective embodiments is omitted for sake of brevity. According to some exemplary embodiments, the geographically distributed storage system 300 comprises three zones (e.g., clusters), zone 1 312A, zone 2 312B, and zone 3 312X. In some embodiments, zone 1 312A stores data chunk A 352A, zone 2 312B stores data chunk 352B and zone 3 312X stores coded chunk X 352X. This type of system where data storage is distributed is known as GEO. In a GEO environment, additional protection of user data is provided by means of replication. The ECS uses XOR technique to minimize capacity overhead associated with this additional data protection. In an aspect, Zone 1 312A replicates data chunk A 352A to zone 3 312X, zone 2 312B replicates data chunk B 352B to zone 3 352X using an XOR operation to create the coded chunk X 352X. As an example, data from data chunk A 352A can undergo an XOR operation, with data from chunk B 352B to form chunk X 352X. Logical operations can be applied to chunk data to allow compressed data to be recoverable, e.g., by reversing the logical operations to revert to the initial chunk data. For example, applying XOR operation to chunk A 352A and chunk X 352X can produce chunk B 352B and applying XOR operation to chunk B 352B and chunk X 352X can produce chunk A 352A. While other logical and/or mathematical operations can be employed in compression of chunks, those operations are generally beyond the scope of the presently disclosed subject matter and, for clarity and brevity, only the XOR operator will be illustrated herein. However, it is noted that the disclosure is not so limited and that those other operations or combinations of operations can be substituted without departing from the scope of the present disclosure. As such, all logical and/or mathematical operations for compression germane to the disclosed subject matter are to be considered within the scope of the present disclosure even where not explicitly recited for the sake of clarity and brevity.

Figure 4:
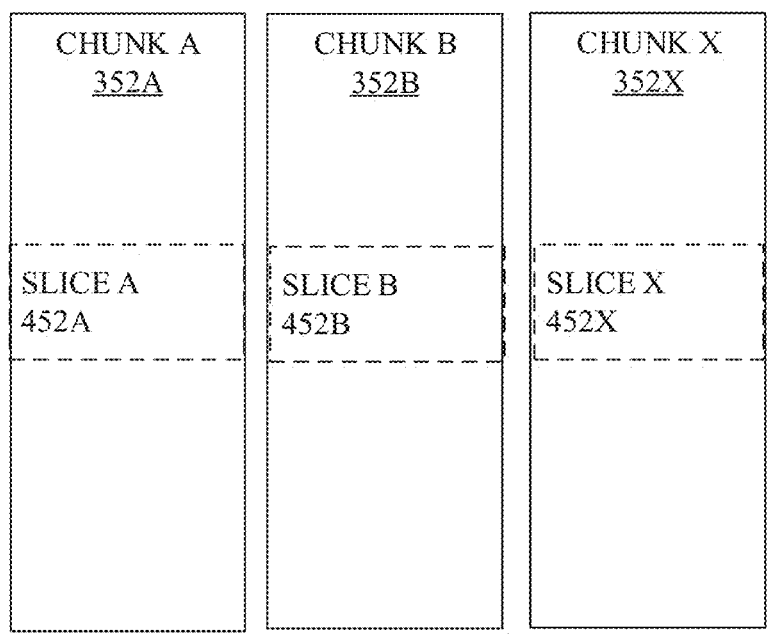
FIG. 4 illustrates an example of a geographically distributed storage system accordance with one or more embodiments described herein.

FIG. 4 illustrates an example of a geographically distributed storage system 400 accordance with one or more embodiments described herein. Repetitive description of like elements employed in respective embodiments is omitted for sake of brevity. According to some embodiments, GEO recovery occurs at the slice level (e.g., recovering 2 MB). The technique extracts a slice of data (e.g., 2 MB, but not limited to 2 MB) from each chunk and performs the XOR operation to recover the slice. For example, a slice A 452A is extracted from data chunk A 352A, a slice B 452B is extracted from data chunk B 352B, and a slice X 452X is extracted from data chunk X 352X. XOR is a bitwise operation such that the technique combines multiple bits of source data chunks in one bit of a XOR chunk.

Figure 5:
FIG. 5 illustrates an example of a geographically distributed storage system accordance with one or more embodiments described herein.

FIG. 5 illustrates an example of a geographically distributed storage system 500 accordance with one or more embodiments described herein. Repetitive description of like elements employed in respective embodiments is omitted for sake of brevity. According to some embodiments, for a fast recovery the chunk manager can determine the offset and the size of the slice. The offset can be determined as an index of the object segment as stored in the inaccessible data chunk (for example, chunk A 352A). In some embodiment, the offset of the object segment can be location of within the data chunk. Once the offset is determined, the slice parameters can be defined using object segment's offset and size within the inaccessible chunk (e.g., chunk A 352A). Once the slice parameters are defined, the corresponding slice X 452X and slice B 452B can be extracted (e.g., read from the corresponding chunks). It should be noted that where more than one chunk (e.g., chunk C, chunk D, etc., not shown) was used to generate the chunk X 352X, a slice from all the data chunks are extracted and a XOR operation is perform using all on the slices, including XOR chunk (e.g., chunk X 352X) to extract the inaccessible slice. For example, the XOR function is performed on the slices (e.g., slice B 552B XOR slice X 552X=slice A 452A) to recover a slice containing the object segment. Once the slice is recovered, the desired object segment can be extracted.

Figure 6:
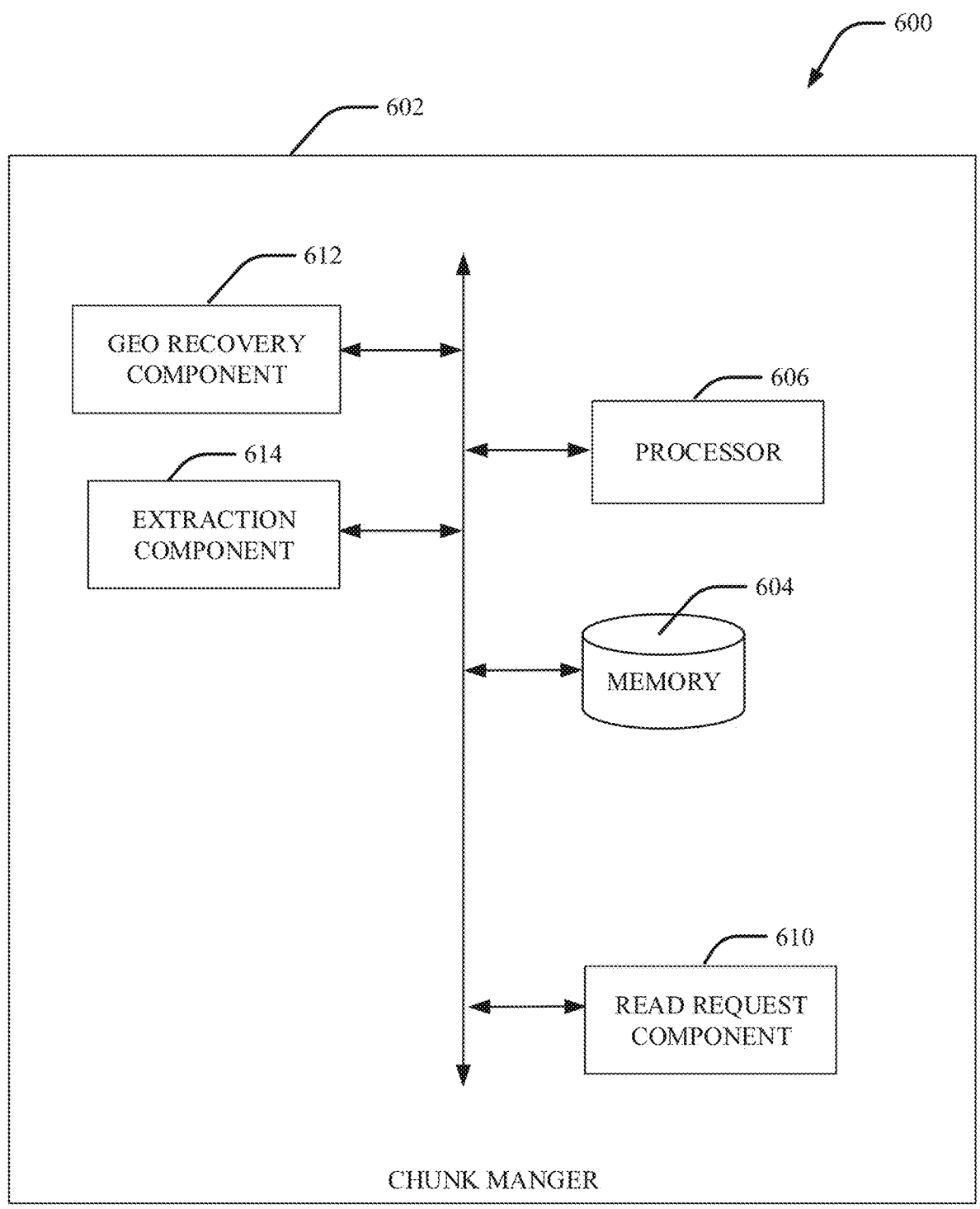
FIG. 6 illustrates an example of a chunk manager operational in a geographically distributed storage system accordance with one or more embodiments described herein.

FIG. 6 illustrates an example of a chunk manager 602 operational in a geographically distributed storage system 600 accordance with one or more embodiments described herein. Repetitive description of like elements employed in respective embodiments is omitted for sake of brevity. In some embodiments, the chunk manager 602 comprises a chunk read request component 610, a GEO recovery component 612 and a segment extraction component 614, a processor 606, and memory 604 that are communicatively coupled to each other. In some embodiments, the chunk manager 602 processes the object segment read request employing the read request component 610. In some embodiment, a read request to read an object segment from a data chunk stored in a geographically diverse data storage system is received at read request component 612. If the data chunk in inaccessible due to, for example, a zone failure, a request is transmitted to the GEO recovery component 612. In some embodiments, the GEO recovery component 612 can execute the GEO recovery process if determined that the chunk containing the requested object segment is inaccessible. The GEO recovery process comprises accessing a first slice (e.g., the slice X 452X) of data (2 MB) from a chunk stored in zone of the geographically diverse data storage system that is designated to serve read request during failures (e.g., chunk X 352X), accessing a second slice (e.g., the slice B 452B) of data from a remote chunk (e.g., chunk B 352B) that was used to create chunk X 352B, and applying an XOR operation to the first slice of data and the second slice of data to determine a third slice of data (e.g., slice from chunk that became inaccessible, the slice A 452A). Once the third slice (e.g., recovered slice) determined, the extraction component 614 can extract the object segment from the third slice. In some embodiments, slice of data can be larger than object segment to ensure that slice includes the object segment. In some embodiments, multiple slices may need to be extracted from acquire the requested object segment. In some embodiments, the read request component 610, the GEO recovery component 612 and the extraction component 614 can comprise one or more processor and additional communication component to communicate with each other and other components of the chunk manager 602.

Aspects of the processor 606 can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described herein. In an aspect, memory 804 can store computer executable components and instructions. It is noted that the memory 804 can comprise volatile memory(s) or nonvolatile memory(s), or can comprise both volatile and nonvolatile memory(s). Examples of suitable types of volatile and non-volatile memory are described below with reference to FIG. 10. The memory (e.g., data stores, databases) of the subject systems and methods is intended to comprise, without being limited to, these and any other suitable types of memory. In some embodiments, the chunk manager 602 can reside in zone and communicatively coupled to one or more of the remaining zones.

Figure 7:
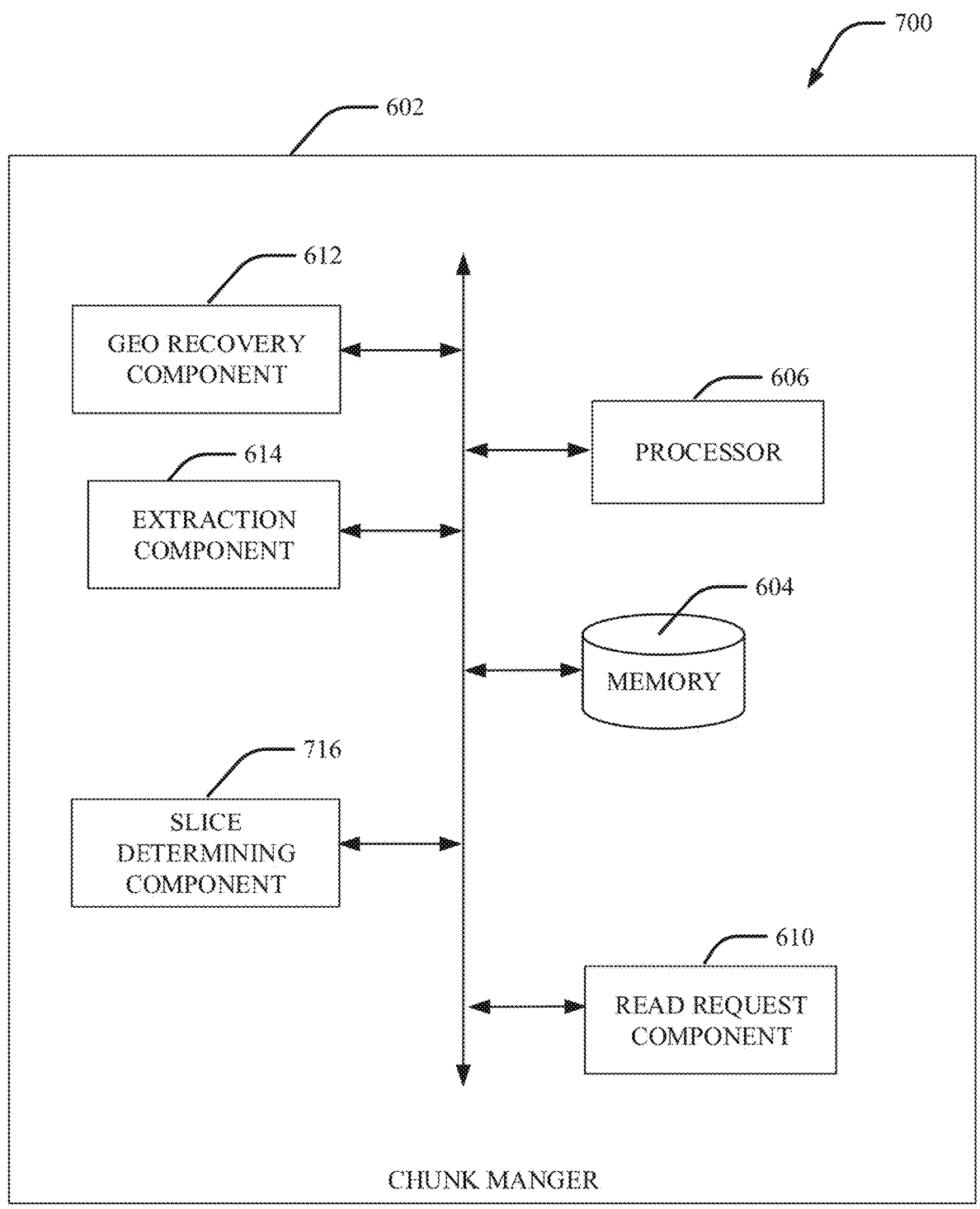
FIG. 7 illustrates an example of a chunk manager operational in a geographically distributed storage system accordance with one or more embodiments described herein.

FIG. 7 illustrates an example of the chunk manager 602 operational in a geographically distributed storage system 700 accordance with one or more embodiments described herein. Repetitive description of like elements employed in respective embodiments is omitted for sake of brevity. In some embodiments, the chunk manager 602 can further comprise a slice determining component 716 that can determine size of the slice by using a start offset (e.g., location of segment object within the inaccessible chunk) and size of the segment object. In some embodiments, the slice determining component 716 can determine size of slice B 452B to extract from chunk B 352B and size of slice X 452X to extract from chunk X 352X, using offset and size of the slice containing the requested object segment. In some embodiments, the slice determining component 716 can comprise one or more processor and additional communication component to communicate with other components of the chunk manager 602.

Figure 8:
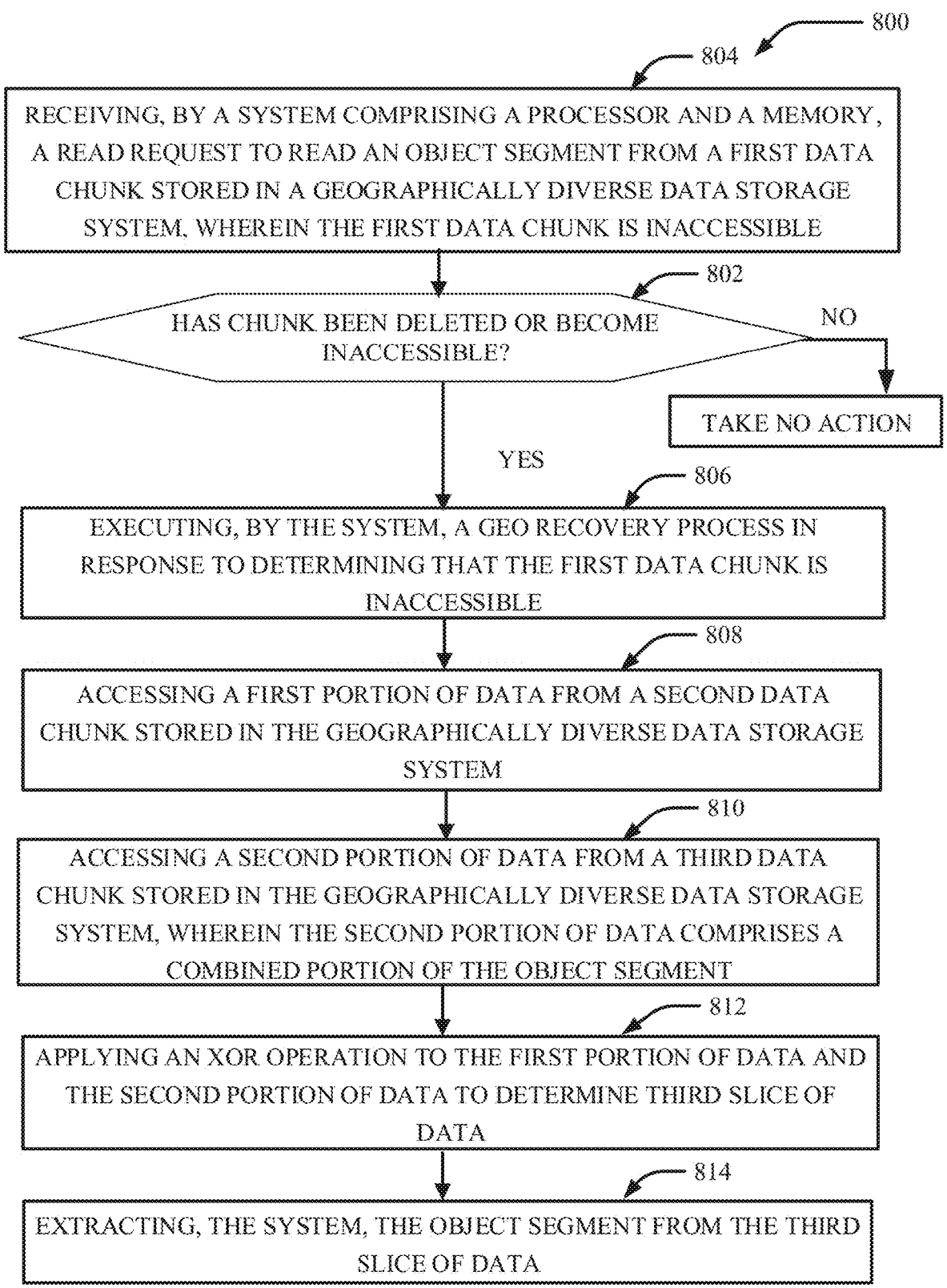
FIG. 8 depicts a diagram of an example, non-limiting computer implemented method that facilitates fast recovery of data in geographically distributed storage system.

FIG. 8 depicts a diagram of an example, non-limiting computer implemented method that facilitates efficient updating of data protection set in geographically distributed storage system. Repetitive description of like elements employed in other embodiments described herein is omitted for sake of brevity. In some examples, flow diagram 800 can be implemented by operating environment 1000 described below. It can be appreciated that the operations of flow diagram 800 can be implemented in a different order than is depicted.

In non-limiting example embodiments, a computing device (or system) (e.g., computer 1012) is provided, the device or system comprising one or more processors and one or more memories that stores executable instructions that, when executed by the one or more processors, can facilitate performance of the operations as described herein, including the non-limiting methods as illustrated in the flow diagrams of FIG. 8.

Operation 802 depicts receiving, by a system comprising a processor and a memory, a read request to read an object segment from a first data chunk stored in a geographically diverse data storage system, wherein the first data chunk is inaccessible. Operation 804 depicts determining if the first data chunk has become inaccessible or deleted. If the first data chunk has become inaccessible or deleted, then perform operation 806. Otherwise, take no action. Operation 806 depicts executing, by the system, a GEO recovery process in response to determining that the first data chunk is inaccessible. Operations 808-812 are operations of the GEO recovery process, wherein operation 808 depicts accessing a first portion of data from a second data chunk stored in the geographically diverse data storage system; operation 810 accessing a second portion of data from a third data chunk stored in the geographically diverse data storage system, wherein the second portion of data comprises a combined portion of the object segment; and operation 812 depicts applying an XOR operation to the first portion of data and the second portion of data to determine third slice of data.

Operation 814 depicts extracting, the system, the object segment from the third slice of data.

Figure 9:
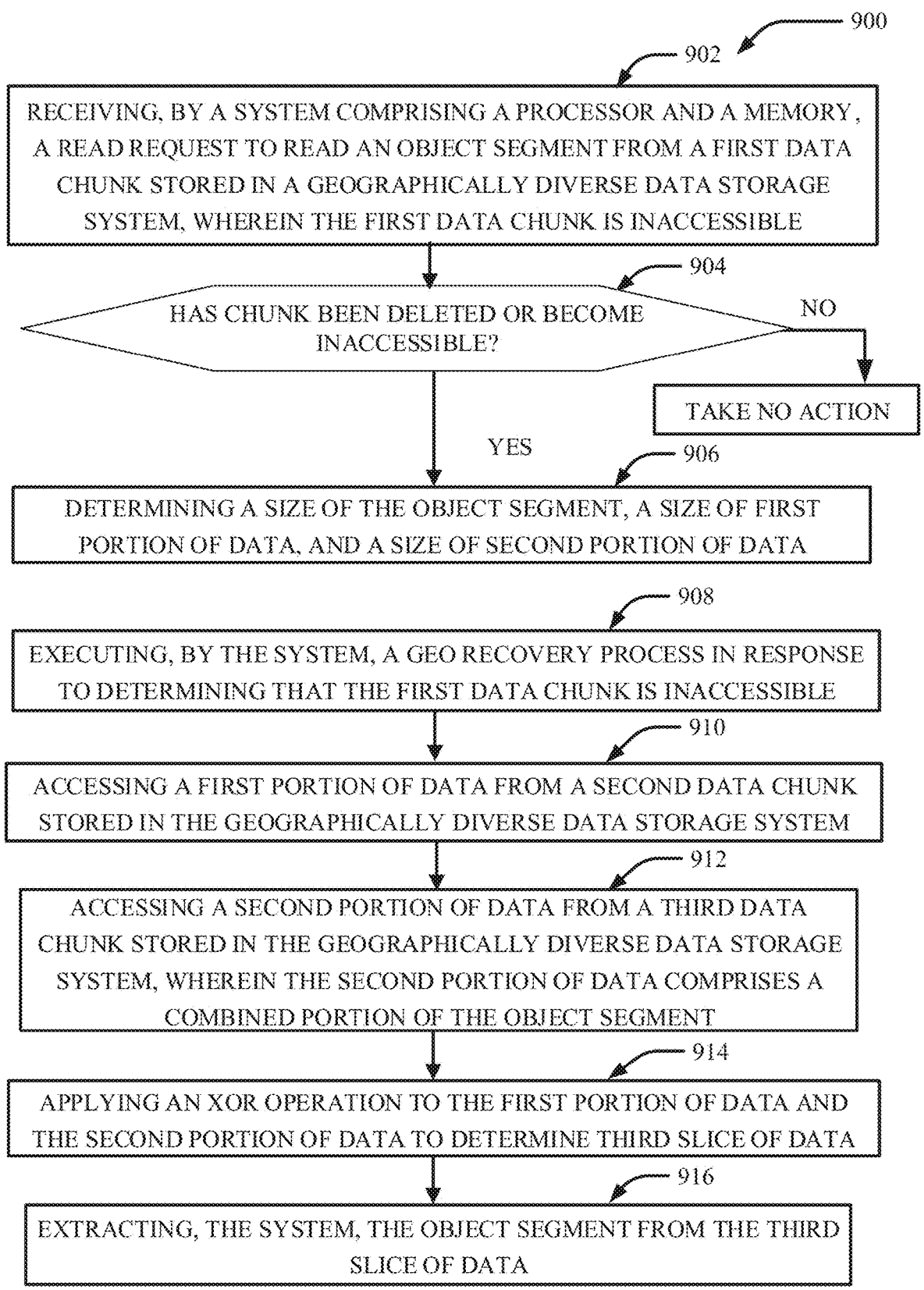
FIG. 9 depicts a diagram of an example, non-limiting computer implemented method that facilitates fast recovery of data in geographically distributed storage system.

FIG. 9 depicts a diagram of an example, non-limiting computer implemented method that facilitates efficient fast recovery of data in geographically distributed storage system. Repetitive description of like elements employed in other embodiments described herein is omitted for sake of brevity. In some examples, flow diagram 900 can be implemented by operating environment 1000 described below. It can be appreciated that the operations of flow diagram 900 can be implemented in a different order than is depicted.

In non-limiting example embodiments, a computing device (or system) (e.g., computer 1012) is provided, the device or system comprising one or more processors and one or more memories that stores executable instructions that, when executed by the one or more processors, can facilitate performance of the operations as described herein, including the non-limiting methods as illustrated in the flow diagrams of FIG. 9.

Operation 902 depicts receiving, by a system comprising a processor and a memory, a read request to read an object segment from a first data chunk stored in a geographically diverse data storage system, wherein the first data chunk is inaccessible. Operation 904 depicts determining if the first data chunk has become inaccessible or deleted. If the first data chunk has become inaccessible or deleted, then perform operation 906. Otherwise, take no action. Operation 906 depicts determining a size of the object segment, a size of first portion of data, and a size of second portion of data. Operation 908 depicts executing, by the system, a GEO recovery process in response to determining that the first data chunk is inaccessible. Operations 910-914 are operations of the GEO recovery process, wherein operation 910 depicts accessing a first portion of data from a second data chunk stored in the geographically diverse data storage system; operation 912 accessing a second portion of data from a third data chunk stored in the geographically diverse data storage system, wherein the second portion of data comprises a combined portion of the object segment; and operation 914 depicts applying an XOR operation to the first portion of data and the second portion of data to determine third slice of data. Operation 916 depicts extracting, the system, the object segment from the third slice of data.

Figure 10:
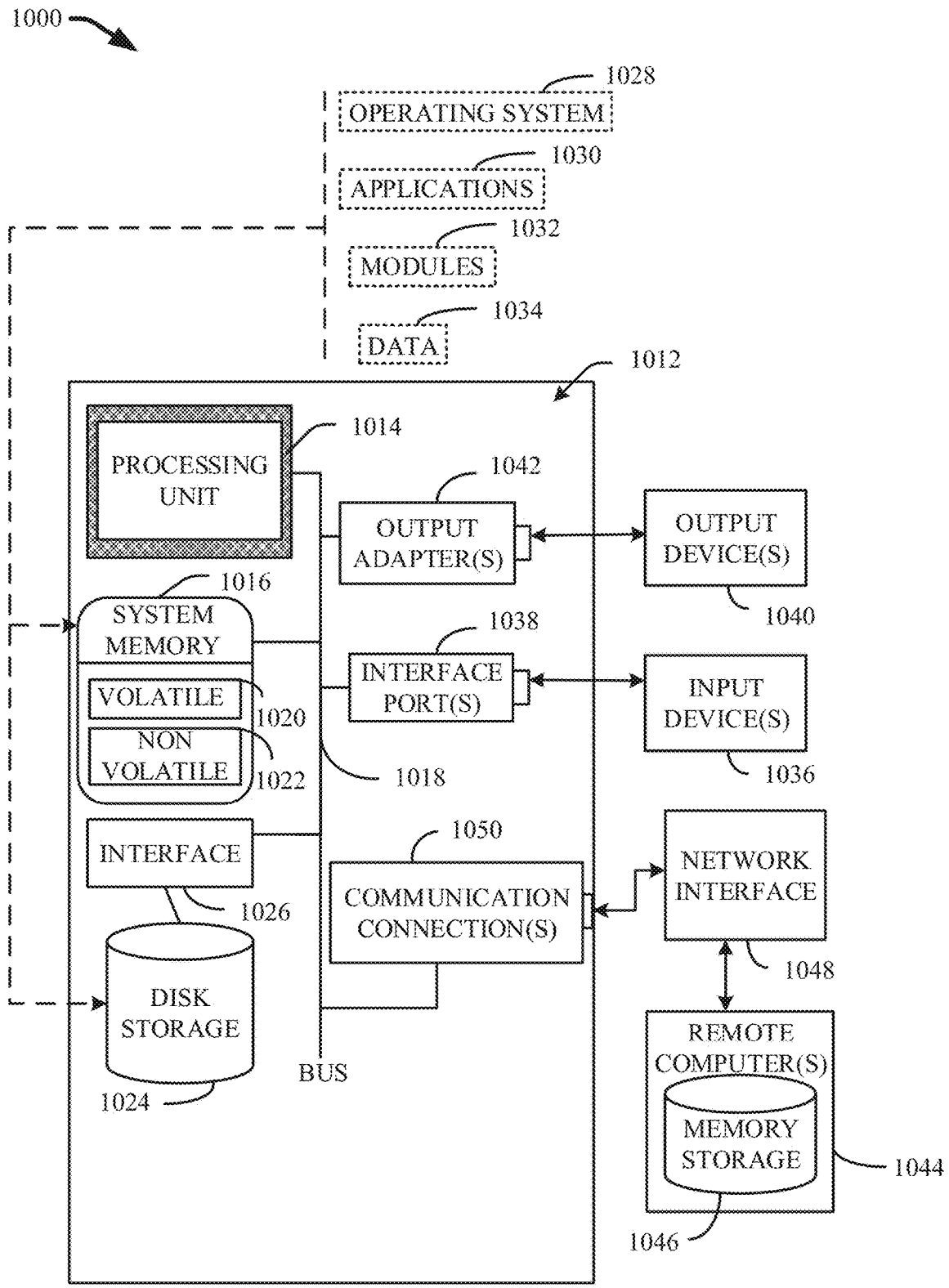
FIG. 10 illustrates a block diagram of an example computer operable to execute updating data protection set in a geographically distributed storage system.

FIG. 10 illustrates a block diagram of an example computer operable to execute recovery of an object segment of a deleted/inaccessible data chunk stored in a geographically distributed storage environment. In order to provide additional context for various aspects of the disclosed subject matter, FIG. 10 and the following discussion are intended to provide a brief, general description of a suitable computing environment 1000 in which the various aspects of the specification can be implemented. While the specification has been described above in the general context of computer-executable instructions that can run on one or more computers, those skilled in the art will recognize that the specification also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices. The illustrated aspects of the specification can also be practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media and/or communications media, which two terms are used herein differently from one another as follows. Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, (e.g., a carrier wave or other transport mechanism), and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, radio frequency (RF), infrared and other wireless media.

With reference to FIG. 10, a block diagram of a computing system 1000 operable to execute the disclosed systems and methods is illustrated, in accordance with an embodiment. Computer 1012 comprises a processing unit 1014, a system memory 1016, and a system bus 1018. As an example, the component(s), server(s), client(s), node(s), cluster(s), system(s), zone(s), module(s), agent(s), engine(s), manager(s), and/or device(s) disclosed herein with respect to systems 400-900 can each include at least a portion of the computing system 1000. System bus 1018 couples system components comprising, but not limited to, system memory 1016 to processing unit 1014. Processing unit 1014 can be any of various available processors. Dual microprocessors and other multiprocessor architectures also can be employed as processing unit 1014.

System bus 1018 can be any of several types of bus structure(s) comprising a memory bus or a memory controller, a peripheral bus or an external bus, and/or a local bus using any variety of available bus architectures comprising, but not limited to, industrial standard architecture (ISA), micro-channel architecture (MSA), extended ISA (EISA), intelligent drive electronics (IDE), VESA local bus (VLB), peripheral component interconnect (PCI), card bus, universal serial bus (USB), advanced graphics port (AGP), personal computer memory card international association bus (PCMCIA), Firewire (IEEE 1394), small computer systems interface (SCSI), and/or controller area network (CAN) bus used in vehicles.

System memory 1016 comprises volatile memory 1020 and nonvolatile memory 1022. A basic input/output system (BIOS), comprising routines to transfer information between elements within computer 1012, such as during start-up, can be stored in nonvolatile memory 1022. By way of illustration, and not limitation, nonvolatile memory 1022 can comprise ROM, PROM, EPROM, EEPROM, or flash memory. Volatile memory 1020 comprises RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 1012 also comprises removable/non-removable, volatile/non-volatile computer storage media. FIG. 10 illustrates, for example, disk storage 1024. Disk storage 1024 comprises, but is not limited to, devices like a magnetic disk drive, floppy disk drive, tape drive, Jaz drive, Zip drive, LS-100 drive, flash memory card, or memory stick. In addition, disk storage 1024 can comprise storage media separately or in combination with other storage media comprising, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1024 to system bus 1018, a removable or non-removable interface is typically used, such as interface 1026.

It is to be appreciated that FIG. 10 describes software that acts as an intermediary between users and computer resources described in suitable operating environment 1000. Such software comprises an operating system 1028. Operating system 1028, which can be stored on disk storage 1024, acts to control and allocate resources of computer system 1012. System applications 1030 take advantage of the management of resources by operating system 1028 through program modules 1032 and program data 1034 stored either in system memory 1016 or on disk storage 1024. It is to be appreciated that the disclosed subject matter can be implemented with various operating systems or combinations of operating systems.

A user can enter commands or information into computer 1012 through input device(s) 1036. Input devices 1036 comprise, but are not limited to, a pointing device such as a mouse, trackball, stylus, touch pad, keyboard, microphone, joystick, game pad, satellite dish, scanner, TV tuner card, digital camera, digital video camera, web camera, cellular phone, user equipment, smartphone, and the like. These and other input devices connect to processing unit 1014 through system bus 1018 via interface port(s) 1038. Interface port(s) 1038 comprise, for example, a serial port, a parallel port, a game port, a universal serial bus (USB), a wireless based port, e.g., Wi-Fi, Bluetooth®, etc. Output device(s) 1040 use some of the same type of ports as input device(s) 1036.

Thus, for example, a USB port can be used to provide input to computer 1012 and to output information from computer 1012 to an output device 1040. Output adapter 1042 is provided to illustrate that there are some output devices 1040, like display devices, light projection devices, monitors, speakers, and printers, among other output devices

1040, which use special adapters. Output adapters 1042 comprise, by way of illustration and not limitation, video and sound devices, cards, etc. that provide means of connection between output device 1040 and system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. Remote computer(s) 1044 can be a personal computer, a server, a router, a network PC, a workstation, a microprocessor based appliance, a peer device, or other common network node and the like, and typically comprises many or all of the elements described relative to computer 1012.

For purposes of brevity, only a memory storage device 1046 is illustrated with remote computer(s) 1044. Remote computer(s) 1044 is logically connected to computer 1012 through a network interface 1048 and then physically and/or wirelessly connected via communication connection 1050. Network interface 1048 encompasses wire and/or wireless communication networks such as local-area networks (LAN) and wide-area networks (WAN). LAN technologies comprise fiber distributed data interface (FDDI), copper distributed data interface (CDDI), Ethernet, token ring and the like. WAN technologies comprise, but are not limited to, point-to-point links, circuit switching networks like integrated services digital networks (ISDN) and variations thereon, packet switching networks, and digital subscriber lines (DSL).

Communication connection(s) 1050 refer(s) to hardware/software employed to connect network interface 1048 to bus 1018. While communication connection 1050 is shown for illustrative clarity inside computer 1012, it can also be external to computer 1012. The hardware/software for connection to network interface 1048 can comprise, for example, internal and external technologies such as modems, comprising regular telephone grade modems, cable modems and DSL modems, wireless modems, ISDN adapters, and Ethernet cards.

The computer 1012 can operate in a networked environment using logical connections via wired and/or wireless communications to one or more remote computers, cellular based devices, user equipment, smartphones, or other computing devices, such as workstations, server computers, routers, personal computers, portable computers, microprocessor-based entertainment appliances, peer devices or other common network nodes, etc. The computer 1012 can connect to other devices/networks by way of antenna, port, network interface adaptor, wireless access point, modem, and/or the like.

The computer 1012 is operable to communicate with any wireless devices or entities operatively disposed in wireless communication, e.g., a printer, scanner, desktop and/or portable computer, portable data assistant, communications satellite, user equipment, cellular base device, smartphone, any piece of equipment or location associated with a wirelessly detectable tag (e.g., scanner, a kiosk, news stand, restroom), and telephone. This comprises at least Wi-Fi and Bluetooth® wireless technologies. Thus, the communication can be a predefined structure as with a conventional network or simply an ad hoc communication between at least two devices.

The computing system 1000 is operable to communicate with any wireless devices or entities operatively disposed in wireless communication, e.g., desktop and/or portable computer, server, communications satellite, etc. This includes at least Wi-Fi and Bluetooth® wireless technologies. Thus, the communication can be a predefined structure as with a conventional network or simply an ad hoc communication between at least two devices.

Wi-Fi, or Wireless Fidelity, allows connection to the Internet from a couch at home, a bed in a hotel room, or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, n, etc.) to provide secure, reliable, fast wireless connectivity. A Wi-Fi network can be used to connect computers to each other, to the Internet, and to wired networks (which use IEEE 802.3 or Ethernet). Wi-Fi networks operate in the unlicensed 5 GHz radio band at a 54 Mbps (802.11a) data rate, and/or a 2.4 GHz radio band at an 11 Mbps (802.11b), a 54 Mbps (802.11g) data rate, or up to a 600 Mbps (802.11n) data rate for example, or with products that contain both bands (dual band), so the networks can provide real-world performance similar to the basic 10BaseT wired Ethernet networks used in many offices.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory in a single machine or multiple machines. Additionally, a processor can refer to an integrated circuit, a state machine, an application specific integrated circuit (ASIC), a digital signal processor (DSP), a programmable gate array (PGA) including a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units. One or more processors can be utilized in supporting a virtualized computing environment. The virtualized computing environment may support one or more virtual machines representing computers, servers, or other computing devices. In such virtualized virtual machines, components such as processors and storage devices may be virtualized or logically represented. In an aspect, when a processor executes instructions to perform "operations", this could include the processor performing the operations directly and/or facilitating, directing, or cooperating with another device or component to perform the operations In the subject specification, terms such as "data store," data storage," "database," "cache," and substantially any other information storage component relevant to operation and functionality of a component, refer to "memory components," or entities embodied in a "memory" or components comprising the memory. It is noted that the memory components, or computer-readable storage media, described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

The illustrated aspects of the disclosure can be practiced in distributed computing environments where certain tasks are performed by remote processing devices that are linked through a communications network. In a distributed computing environment, program modules can be located in both local and remote memory storage devices.

The systems and processes described above can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders that are not all of which may be explicitly illustrated herein.

As used in this application, the terms "component," "module," "system," "interface," "cluster," "server," "node," or the like are generally intended to refer to a computer-related entity, either hardware, a combination of hardware and software, software, or software in execution or an entity related to an operational machine with one or more specific functionalities. For example, a component can be, but is not limited to being, a process running on a processor, a processor, an object, an executable, a thread of execution, computer-executable instruction(s), a program, and/or a computer. By way of illustration, both an application running on a controller and the controller can be a component. One or more components may reside within a process and/or thread of execution and a component may be localized on one computer and/or distributed between two or more computers. As another example, an interface can include input/output (I/O) components as well as associated processor, application, and/or API components.

Furthermore, the terms "user," "consumer," "client," and the like are employed interchangeably throughout the subject specification, unless context warrants particular distinction(s) among the terms. It is noted that such terms can refer to human entities or automated components/devices supported through artificial intelligence (e.g., a capacity to make inference based on complex mathematical formalisms), which can provide simulated vision, sound recognition and so forth.

Further, the various embodiments can be implemented as a method, apparatus, or article of manufacture using standard programming and/or engineering techniques to produce software, firmware, hardware, or any combination thereof to control a computer to implement one or more aspects of the disclosed subject matter. An article of manufacture can encompass a computer program accessible from any computer-readable device or computer-readable storage/communications media. For example, computer readable storage media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Of course, those skilled in the art will recognize many modifications can be made to this configuration without departing from the scope or spirit of the various embodiments.

Artificial intelligence based systems, e.g., utilizing explicitly and/or implicitly trained classifiers, can be employed in connection with performing inference and/or probabilistic determinations and/or statistical-based determinations as in accordance with one or more aspects of the disclosed subject matter as described herein. For example, an artificial intelligence system can be used to dynamically perform operations as described herein.

A classifier can be a function that maps an input attribute vector, $x=(x1, x2, x3, x4, xn)$, to a confidence that the input belongs to a class, that is, $f(x)=$confidence (class). Such classification can employ a probabilistic and/or statistical-based analysis (e.g., factoring into the analysis utilities and costs) to infer an action that a user desires to be automatically performed. In the case of communication systems, for example, attributes can be information received from access points, servers, components of a wireless communication network, etc., and the classes can be categories or areas of interest (e.g., levels of priorities). A support vector machine is an example of a classifier that can be employed. The support vector machine operates by finding a hypersurface in the space of possible inputs, which the hypersurface attempts to split the triggering criteria from the non-triggering events. Intuitively, this makes the classification correct for testing data that is near, but not identical to training data. Other directed and undirected model classification approaches include, e.g., naïve Bayes, Bayesian networks, decision trees, neural networks, fuzzy logic models, and probabilistic classification models providing different patterns of independence can be employed. Classification as used herein can also be inclusive of statistical regression that is utilized to develop models of priority.

In accordance with various aspects of the subject specification, artificial intelligence based systems, components, etc. can employ classifiers that are explicitly trained, e.g., via a generic training data, etc. as well as implicitly trained, e.g., via observing characteristics of communication equipment, e.g., a server, etc., receiving reports from such communication equipment, receiving operator preferences, receiving historical information, receiving extrinsic information, etc. For example, support vector machines can be configured via a learning or training phase within a classifier constructor and feature selection module. Thus, the classifier(s) can be used by an artificial intelligence system to automatically learn and perform a number of functions.

In addition, the word "example" or "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What has been described above includes examples of the present specification. It is, of course, not possible to describe every conceivable combination of components or methods for purposes of describing the present specification, but one of ordinary skill in the art may recognize that many further combinations and permutations of the present specification are possible. Accordingly, the present specification is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system, comprising:
a processor; and
a memory that stores executable instructions that, when executed by the processor, facilitate performance of operations, comprising:
receiving a read request to read an object segment from a first data chunk stored in a geographically diverse data storage system, wherein the first data chunk is inaccessible;
executing a GEO recovery process, to recover the object segment without recovering the first chunk, in response to determining that the first data chunk is inaccessible, wherein the GEO recovery process comprises accessing a first slice of data from a second data chunk stored in the geographically diverse data storage system, accessing a second slice of data from a third data chunk stored in the geographically diverse data storage system, and applying an XOR operation to the first slice of data and the second slice of data to determine a third slice of data; and
extracting the object segment from the third slice of data;
determining a start offset of the object segment within the first data chunk;
determining a first size of the object segment;
determining a second size of the first slice of data; and
determining a third size of the second slice of data, wherein the second size of the first slice of data and the third size of the second slice of data are based on the first size of the object segment, wherein the second slice of data comprises all data associated with the object segment and the second size of the first slice of data is a same size as the third size of the second slice of data.

2. The system of claim 1, wherein the third data chunk is a result of an XOR combination of the first data chunk and the second data chunk.

3. The system of claim 1, wherein the third data chunk comprises a first data portion from the first data chunk and a second data portion from the second data chunk.

4. The system of claim 1, wherein the third data chunk comprises a combined version of the object segment based on an XOR combination of the first data chunk and the second data chunk.

5. The system of claim 1, wherein the second slice of data comprises a first portion of the object segment and a second portion of data from the second data chunk.

6. The system of claim 1, wherein the operations further comprise:

accessing one or more additional slices of data other than the first slice of data, the second slice of data and the third slice of data.

7. A method, comprising:
receiving, by a system comprising a processor and a memory, a read request to read an object segment from a first data chunk stored in a geographically diverse data storage system, wherein the first data chunk is inaccessible;
executing, by the system, a GEO recovery process, to recover the object segment without recovering the first chunk, in response to determining that the first data chunk is inaccessible, wherein the GEO recovery process comprises:
accessing a first portion of data from a second data chunk stored in the geographically diverse data storage system,
accessing a second portion of data from a third data chunk stored in the geographically diverse data storage system, wherein the second portion of data comprises a combined portion of the object segment, and
applying an XOR operation to the first portion of data and the second portion of data to determine a third portion of data;
extracting, by the system, the object segment from the third portion of data;
determining, by the system, a start offset of the object segment within the first data chunk;
determining, by the system, a first size of the object segment;
determining, by the system, a second size of the first portion of data; and
determining, by the system, a third size of the second portion of data, wherein the second size of the first portion of data and the third size of the second portion of data are based on the first size of the object segment, wherein the second portion of data comprises all data associated with the object segment and the second size of the first portion of data is a same size as the third size of the second portion of data.

8. The method of claim 7, wherein the third data chunk is a result of convolving the first data chunk and the second data chunk.

9. The method of claim 7, wherein the third data chunk comprises a combined version of the object segment based on combination of the first data chunk and the second data chunk, and wherein the combination comprises application of an XOR function to the first data chunk and the second data chunk.

10. The method of claim 7, wherein the second portion of data comprises a portion of the object segment and a portion of data from the second data chunk.

11. The method of claim 7, wherein the GEO recovery process further comprises:
accessing one or more additional portions of data from one or more additional data chunks in the geographically diverse data storage system.

12. The method of claim 7, wherein the third data chunk is a result of an XOR combination of the first data chunk and the second data chunk.

13. The method of claim 7, wherein the third data chunk comprises a first data portion from the first data chunk and a second data portion from the second data chunk.

14. The method of claim 7, wherein the third data chunk comprises a combined version of the object segment based on an XOR combination of the first data chunk and the second data chunk.

15. A non-transitory machine-readable medium, comprising executable instructions that, when executed by a processor, facilitate performance of operations, comprising:

receiving a read request to read an object segment from a first data chunk stored in a geographically diverse data storage system;

determining that the first data chunk is inaccessible;

executing GEO recovery instructions, to recover the object segment without recovering the first chunk, in response to determining that the first data chunk is inaccessible, wherein the executing of the GEO recovery instructions comprises accessing a first portion of data from a second data chunk stored in the geographically diverse data storage system, accessing a second portion of data from a third data chunk stored in the geographically diverse data storage system, and applying an XOR operation to the first portion of data and the second portion of data to determine a third portion of data;

extracting the object segment from the third portion of data;

determining a start offset of the object segment within the first data chunk;

determining a first size of the object segment;

determining a second size of the first portion of data; and determining a third size of the second portion of data, wherein the second size of the first portion of data and the third size of the second portion of data are based on the first size of the object segment, wherein the second slice of data comprises all data associated with the object segment and the second size of the first portion of data is a same size as the third size of the second portion of data.

16. The non-transitory machine-readable medium of claim 15, wherein the operations further comprise:

receiving read request for an additional group of object segments, other than the object segment, from a group of data chunks.

17. The non-transitory machine-readable medium of claim 15, wherein the third data chunk results from convolving of the first data chunk and the second data chunk.

18. The non-transitory machine-readable medium of claim 15, wherein the third data chunk comprises a combined version of the object segment based on a combination of the first data chunk and the second data chunk, and wherein the second portion of data comprises the combined version of the object segment.

19. The non-transitory machine-readable medium of claim 15, wherein the second portion of data comprises a first portion of the object segment and a second portion of data from the second data chunk.

20. The non-transitory machine-readable medium of claim 15, wherein the operations further comprise:

accessing one or more additional portions of data other than the first portion of data, the second portion of data, and the third portion of data.

* * * * *